United States Patent
Yabumoto et al.

(10) Patent No.: US 7,971,165 B2
(45) Date of Patent: Jun. 28, 2011

(54) METHOD AND APPARATUS FOR LOGIC EQUIVALENCE VERIFICATION, AND COMPUTER PRODUCT

(75) Inventors: Noriko Yabumoto, Kawasaki (JP); Akiko Satoh, Kawasaki (JP); Zhengjun Zhang, Kawasaki (JP); Takashi Matsuura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 386 days.

(21) Appl. No.: 12/081,127

(22) Filed: Apr. 1, 2008

(65) Prior Publication Data

US 2008/0256498 A1 Oct. 16, 2008

(30) Foreign Application Priority Data

Apr. 11, 2007 (JP) ................................. 2007-103846

(51) Int. Cl.
*G06F 17/50* (2006.01)
*G06F 9/455* (2006.01)
(52) U.S. Cl. .................... 716/106; 716/107; 716/111
(58) Field of Classification Search .................. 716/3, 4, 716/106, 107, 111
See application file for complete search history.

(56) References Cited

U.S. PATENT DOCUMENTS

| 7,266,790 B2 * | 9/2007 | Pandey et al. ...................... 716/4 |
| 2004/0098683 A1 * | 5/2004 | Maruyama et al. ................ 716/5 |
| 2004/0261043 A1 * | 12/2004 | Baumgartner et al. ........... 716/4 |
| 2007/0234242 A1 * | 10/2007 | Inui et al. ........................... 716/1 |

FOREIGN PATENT DOCUMENTS

JP 2001-67379 3/2001

* cited by examiner

*Primary Examiner* — Stacy A Whitmore
*Assistant Examiner* — Magid Y Dimyan
(74) *Attorney, Agent, or Firm* — Staas & Halsey LLP (57) ABSTRACT

A verification apparatus that verifies whether a reference circuit and an implemented circuit are logically equivalent deletes, respectively therefrom, all buffers and an even number of inverters between flip-flops. On each of the circuits, the apparatus further deletes and merges a flip-flop to another flip-flop that is logically equivalent. The name of the deleted flip-flip is added to the name of the flip-flop to which it is merged. The apparatus compares all of the names of the flip-flops and pairs the flip-flops by name. From the input pin of each of the paired flip-flops, logic cones are defined and using these logic cones, comparison of and verification between the reference circuit and the implemented circuit is performed.

18 Claims, 11 Drawing Sheets

| DELETED FLIP-FLOP | REMAINING FLIP-FLOP |
|---|---|
| FF_K | FF_L |
| FF_J | FF_L |
| FF_M | FF_N |
| FF_N | FF_P |
| FF_Q | FF_R |
| FF_T | FF_R |

METHOD AND APPARATUS FOR LOGIC EQUIVALENCE VERIFICATION, AND COMPUTER PRODUCT

CROSS-REFERENCE TO RELATED APPLICATIONS

This application is based upon and claims the benefit of priority from the prior Japanese Patent Application No. 2007-103846, filed on Apr. 11, 2007, the entire contents of which are incorporated herein by reference.

BACKGROUND

1. Field

The embodiment relates to a technology of equivalence verification.

2. Description of the Related Art

In the design of integrated circuits, a synchronizer for compensating timing is inserted in a (asynchronous) path between two flip-flops driven by different asynchronous clock signals to avoid metastability. Generally, a synchronizer includes one or more flip-flops. A signal input to a flip-flop is delayed by one clock and output. Hence, even when the flip-flop is inserted in the asynchronous path, it does not affect the logic values of other combinational circuits.

Figure 1:
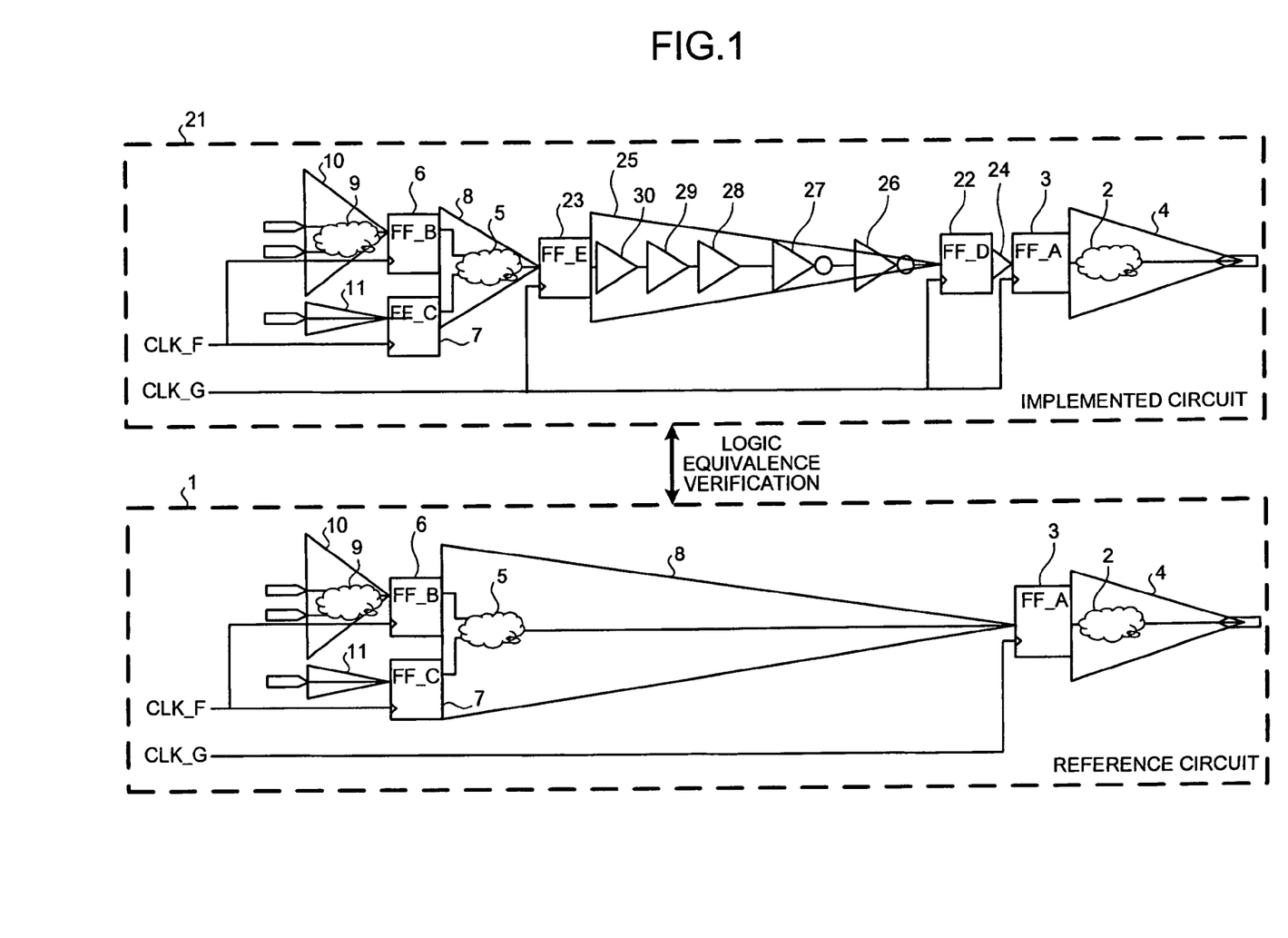
FIG. 1 is a schematic of a typical algorithm indicative of two circuits to be subjected to logic equivalence verification.

FIG. 1 is a schematic of a typical algorithm indicative of two circuits to be subjected to logic equivalence verification. In a reference circuit 1, a first logic cone 4 is coupled to a second logic cone 8 to which a third logic cone 10 and a sixth logic cone 11 are coupled. The first logic cone 4 starts from an output port of the reference circuit 1 and includes a first combinational circuit 2. The second logic cone 8 starts from input terminals of a flip-flop to be deleted after the merge process A (FF_A) 3 and includes a second combinational circuit 5. The third logic cone 10 starts from input terminals of a flip-flop to remain after the merge process B (FF_B) 6 and includes a third combinational circuit 9. The sixth logic cone 11 starts from input terminals of a third flip-flop C (FF_C) 7. The second and the third flip-flops (FF_B) 6 and (FF_C) 7 are driven by a clock signal F (CLK_F). The flip-flop to be deleted after the merge process (FF_A) 3 is driven by a clock signal G (CLK_G).

In an implemented circuit 21, a fourth and a fifth flip-flops D (FF_D) 22 and E (FF_E) 23 are inserted in an asynchronous path between the second combinational circuit 5 and the flip-flop to be deleted after the merge process (FF_A) 3. The fourth and the fifth flip-flops (FF_D) 22 and (FF_E) 23 are driven by the click signal G (CLK_G). A fourth logic cone 24 that starts from the input terminals of the flip-flop to be deleted after the merge process (FF_A) 3 is coupled to the first logic cone 4. A fifth logic cone 25 that starts from input terminals of the fourth flip-flop (FF_D) 22 is coupled to the fourth logic cone 24. The second logic cone 8 that starts from input terminals of the fifth flip-flop (FF_E) 23 is coupled to the fifth logic cone 25.

Inverters 26 and 27, buffers 28 to 30 may be inserted between the fourth flip-flop (FF_D) 22 and the fifth flip-flop (FF_E) 23. In the logic equivalence verification, the logic cones having an identical name between the reference circuit 1 and the implemented circuit 21 are paired, and verification between the logic cones of the two circuits is performed. When all the logic cones logically match each other, it is judged that the reference circuit 1 and the implemented circuit 21 are logically identical. Generally, a logic cone is a unit block for logic equivalence verification; starts from an output terminal, input terminals of a flip-flop, or an input pin of a black box module; and ends at an input terminal, an output terminal of a flip-flop, or an output pin of a black box module.

A logic-equivalence verification method has been disclosed for the case in which among two logics subjected to the logic equivalence verification, one of the logic includes an additional logic that is not included in the other logic. In the method, equivalence between the logic from which the additional logic is deleted and the other logic is verified based on information concerning the additional logic (see, for example, Japanese Patent Application Laid-open Publication No. 2001-67379).

However, according to the conventional logic-equivalence verification method, since the elements having an identical name are paired to compare logic cones with each other, mismatch occurs between the second logic cone 8 that starts from the input terminal of the flip-flop to be deleted after the merge process (FF_A) 3 and the fourth logic cone 24 though the reference circuit 1 and the implemented circuit 21 are logically identical in the case of FIG. 1. In this case, a designer has to check each part at which an error is detected as a mismatch, or add, to a specification file, information indicating that the fifth flip-flop (FF_E) 23 in the implemented circuit 21 and the flip-flop to be deleted after the merge process (FF_A) 3 in the reference circuit 1 are paired. Such manual operations are troublesome, time consuming, and may lead to mistakes. Furthermore, in the method disclosed in Japanese Patent Application Laid-open Publication No. 2001-67379, deletion of the additional logic based on information concerning the additional logic is troublesome.

SUMMARY

The embodiment provides that a verifying apparatus including a merging unit deleting a first flip-flop which is logically equivalent to a second flip-flop and merging the first flip-flop to the second flip-flop on a reference circuit and a implemented circuit respectively based on design data of the reference circuit and the implemented circuit which is logically equivalent to the reference circuit, and a matching unit matching the second flip-flop which remains after the merge process on the reference circuit and the second flip-flop on the implemented circuit according to name checking whether the name of the second flip-flop on the reference circuit and the name of the second flip-flop on the implemented circuit are identical, after the merging unit deletes and merges the first flip-flop.

DETAILED DESCRIPTION OF THE EMBODIMENTS

Referring to the accompanying drawings, exemplary embodiments of a method and an apparatus for a logic equivalence verification, and a computer product according to embodiments are explained in detail below.

Figure 2:
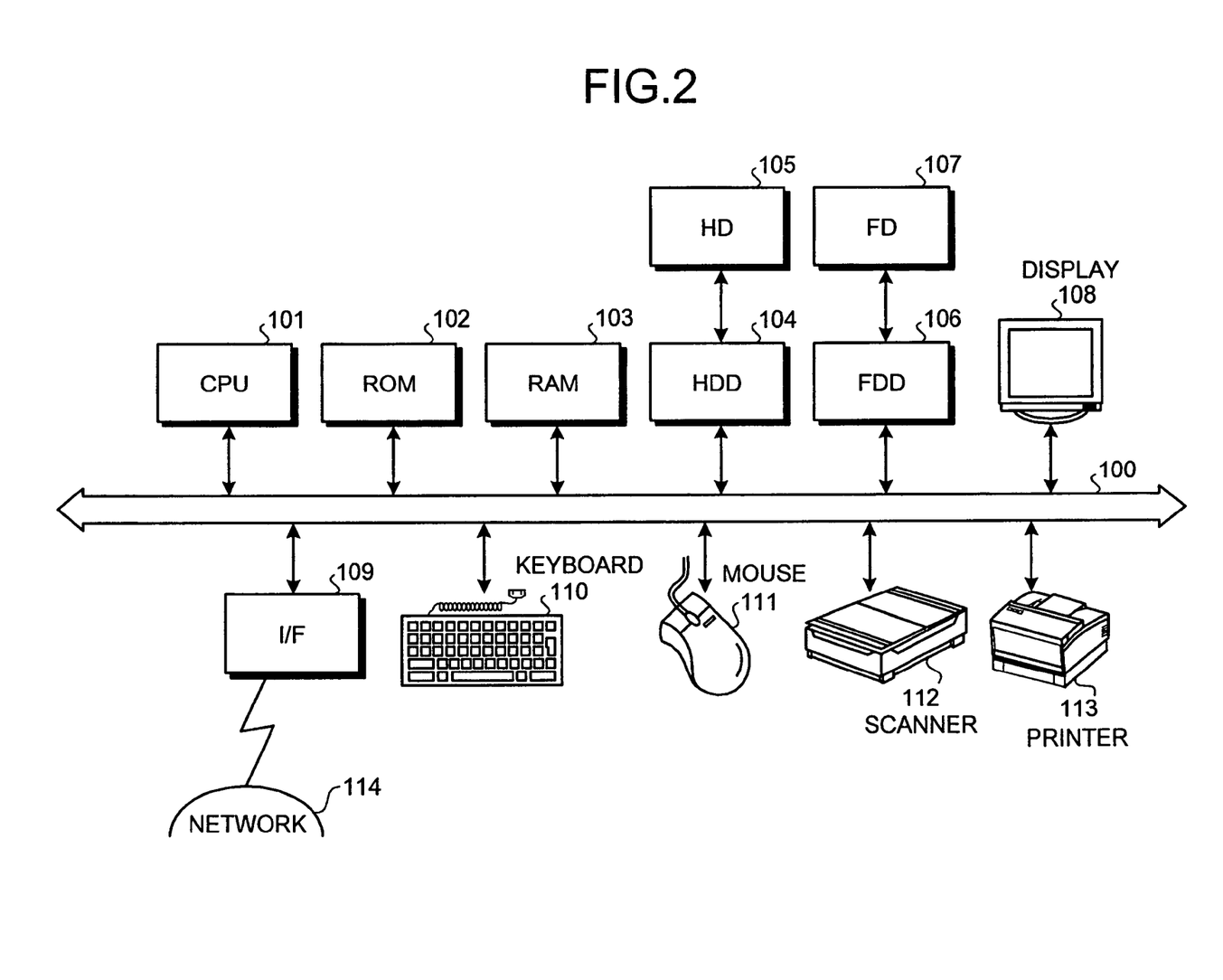
FIG. 2 is a block diagram of a logic-equivalence verification apparatus according to one embodiment.

FIG. 2 is a block diagram of a logic-equivalence verification apparatus according to one embodiment. The logic-equivalence verification apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. The above units are coupled via a bus 100.

The CPU 101 controls the entire logic-equivalence verification apparatus. The ROM 102 stores a program such as a boot program. The RAM 103 is used as a work area of the CPU 101. The HDD 104 controls the reading/writing of data from/to the HD 105 under the control of the CPU 101. The HD 105 stores data that is written into the HD 105 under the control of the HDD 104.

The FDD 106 controls the reading/writing of data from/to the FD 107 under the control of the CPU 101. The FD 107 stores data that is written into the FD 107 under the control of the FDD 106, and causes the logic-equivalence verification apparatus to read data stored in the FD 107.

A compact disc read-only memory (CD-ROM) (or compact disc-recordable (CD-R), compact disc-rewritable (CD-RW), etc.), a magneto optical (MO) disc, a digital versatile disc (DVD), and a memory card may be used as a removable recording medium besides the FD 107. The display 108 displays not only a cursor, an icon, and a tool box, but also data such as documents, images, information of functions, etc. For example, a cathode-ray tube (CRT), a thin-film transistor (TFT) display, a plasma display may be employed as the display 108.

The I/F 109 is coupled to a network 114 such as the Internet via communication lines, and coupled to other devices via the communication lines. The I/F 109 is an interface between the network 114 and the logic-equivalence verification apparatus, and controls input/output from/to external devices. For example, a modem and a local area network (LAN) adapter may be employed as the I/F 109.

The keyboard 110 includes plural keys to input characters, numbers, various instructions, etc. An input pad having a touch panel and a numeric key pad may be employed as the keyboard 110. The mouse 111 is for moving a cursor, selecting key range, moving a window, changing the size of a window, etc. A trackball or a joystick that has a similar function to the function of a pointing device may be employed instead of the mouse 111.

The scanner 112 optically reads an image and inputs image data into the logic-equivalence verification apparatus. The scanner 112 may have a function of optical character recognition (OCR). The printer 113 prints out image data and document data. For example, a laser printer or an ink-jet printer may be employed as the printer 113.

Figure 3:
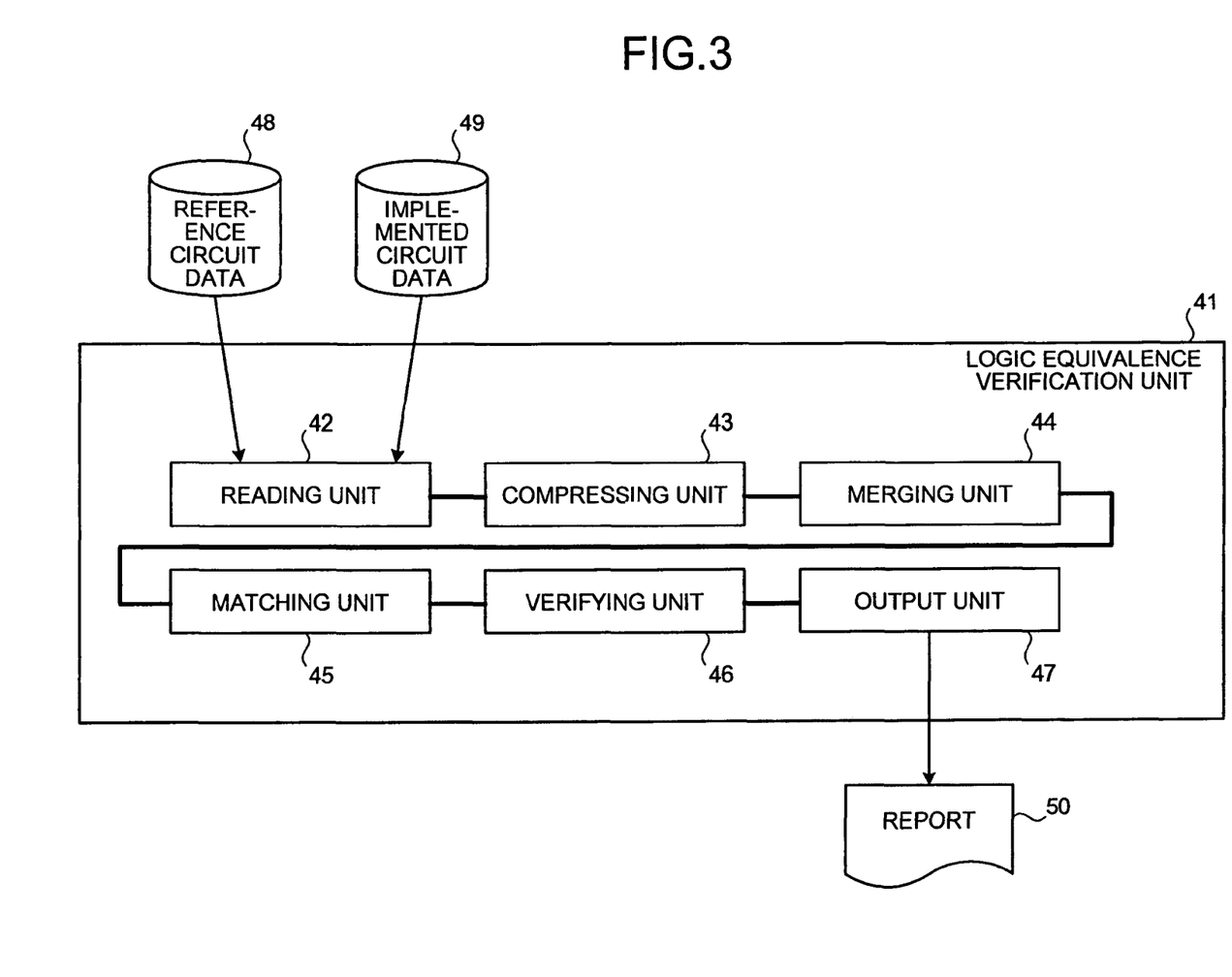
FIG. 3 is a functional configuration of the logic-equivalence verification apparatus of one embodiment.

FIG. 3 is a functional configuration of the logic-equivalence verification apparatus. A logic-equivalence verification apparatus 41 includes a reading unit 42, a compressing unit 43, a merging unit 44, a matching unit 45, a verifying unit 46, and an output unit 47.

The reading unit 42 reads reference circuit data 48 such as a register transfer level (RTL) and a netlist, and implemented circuit data 49 such as RTL and a netlist. There may be a buffer or an inverter between flip-flops to be deleted by a merge process explained later. Since input logic and output logic of a buffer are identical, deletion of the buffer does not affect the logic. As input and output of an inverter are inverted with respect to each other, deletion of an even number of inverters does not affect the logic.

The compressing unit 43 deletes a buffer and inverters to compress the logic. The compressing unit 43 deletes all of the buffers and an even number of inverters. For example, in the case of the implemented circuit 21 shown in FIG. 1, the compressing unit 43 deletes all the buffers 28 to 30 and an even number of the inverters 26 and 27 (here, two) between the fourth and the fifth flip-flops (FF_D) 22 and (FF_E) 23. The compressing unit 43 performs the logic compression process on both the reference circuit 1 and the implemented circuit 21.

The merging unit 44 deletes and merges a logically equivalent flip-flop such as a synchronizer and a level shifter to an upstream flip-flop based on compressed circuit data, i.e., consolidates the flip-flops into one flip-flop. The merging unit 44 adds the register name of the deleted flip-flop to the name of the remaining flip-flop, thereby also retaining the register name of the deleted flip-flop.

For example, in the case of the implemented circuit 21 shown in FIG. 1, since the fourth flip-flop (FF_D) 22 and the fifth flip-flop (FF_E) 23 do not affect the logic of other circuits, the merging unit 44 deletes and merges the two flip-flops (FF_D) 22 and (FF_E) 23 to the flip-flop to be deleted after the merge process (FF_A) 3, and changes the register name of the flip-flop to be deleted after the merge process (FF_A) 3 to FF_A, FF_D, and FF_E. The merging unit 44 performs the merge process on both the reference circuit 1 and the implemented circuit 21. The flip-flop merging unit 44 performs the merging process when the following conditions are satisfied.

(1) The flip-flop to be deleted and the flip-flop to remain after the merge process are driven by an identical clock signal. The merging unit 44 determines that the two flip-flops are driven by an identical clock signal when the names of two clock signals driving the two flip-flops are identical, when an externally supplied clock domain group is identical for two clock signals driving the two flip-flops, or when, based on a backtrace of the clock signals, the clock domain is judged to be identical for the two flip-flops. For example, in the case of the implemented circuit 21 shown in FIG. 1, since the fourth flip-flop (FF_D) 22 and the fifth flip-flop (FF_E) 23 are driven by the clock signal G (CLK_G) driving the flip-flop to be deleted after the merge process (FF_A) 3, condition (1) above is satisfied.

(2) The flip-flop to be deleted is the type in which the data line has one input and one output. If a flip-flop having plural inputs or outputs is merged to another flip-flop, trouble occurs in that the circuit that the signal input to the flip-flop or output from the flip-flop probably loses its destination. As a result, the merging process may not be performed. For example, in the case of the implemented circuit 21 shown in FIG. 1, since each of the fourth and the fifth flip-flops (FF_D) 22 and (FF_E) are of the type in which the data line has one input and one output, condition (2) above is satisfied.

(3) No logic circuit is present between plural flip-flops to be deleted.

(4) The flip-flop to be deleted and the flip-flop to remain after the merging process are of an identical type. Flip-flop types include a simple type of flip-flop having only input pins of a data pin (DATA) and a clock pin (CLK), a type of flip-flop that is not a simple type having in addition to the input pins (the data and the clock pins), a set pin (SET) and/or a reset pin (RESET). Flip-flops having an identical input pin type may be subjected to the merge process.

However, the simple type of flip-flop may be merged to any type of flip-flop, even if the two flip-flops do not have an identical input pin type. In this case, the simple type of flip-flop is deleted, and the non-simple type of flip-flop remains after the merging process. For example, in the case of the implemented circuit 21 shown in FIG. 1, since the fourth and the fifth flip-flops (FF_D) 22 and (FF_E) 23 are of the simple type of flip-flop and the same as the flip-flop to be deleted after the merge process (FF_A) 3, condition (4) above is satisfied.

The matching unit 45 pairs the flip-flops in the implemented circuit with the flip-flops in the reference circuit based on the implemented circuit data and the reference circuit data after the merge process, and checks whether the names of the flip-flops match between the implemented circuit and the reference circuit. When the names of the flip-flops do not match between the two circuits, the flip-flops may be paired in a different way. However, no such reference is made herein. The verifying unit 46 performs verification between the reference circuit and the implemented circuit by comparing a logic cone in the implemented circuit and a logic cone in the reference circuit, two of which start from the input terminals of the flip-flops paired by the matching unit 45, respectively. The output unit 47 outputs a report 50 concerning a verification result by the verifying unit 46.

Specifically, the reading unit 42, the compressing unit 43, the merging unit 44, the matching unit 45, the verifying unit 46, and the output unit 47 are implemented by the CPU 101 executing a program stored in a recording medium such as the ROM 102, the RAM 103, and the HD 105, or by the I/F 109.

Figure 4:
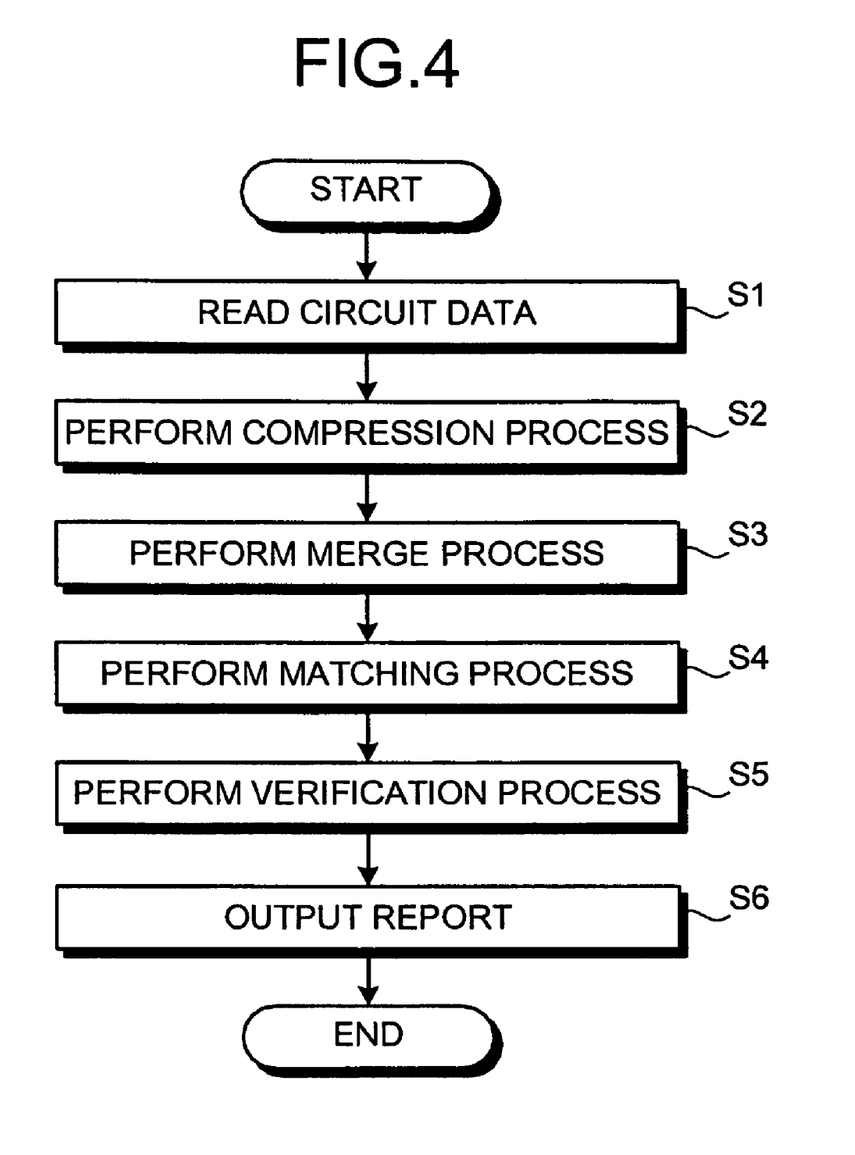
FIG. 4 is a flowchart of a process performed by the logic-equivalence verifying apparatus of one embodiment.

FIG. 4 is a flowchart of a process performed by the logic-equivalence verifying apparatus. As shown in FIG. 4, the reading unit 42 reads the reference circuit data 48 and the implemented circuit data 49 (step S1). For example, the implemented circuit data 49 is data of a circuit including the reference circuit into which a flip-flop is inserted as a countermeasure for metastability.

The compressing unit 43 performs, for both the reference circuit and the implemented circuit, a compression process of deleting a buffer and/or inverters (step S2). The compression process will be explained later. The merging unit 44 performs, for both the reference circuit and the implemented circuit, the merge process of merging flip-flops (step S3). The merge process will be explained later.

The matching unit 45 pairs corresponding logic cones in the reference circuit and the implemented circuit. Here, a name matching process of checking whether names of flip-flops are identical is performed (step S4). The name matching process will be explained later. The verifying unit 46 performs a verification process to verify whether the logic of the reference circuit and the implemented circuit is identical (step S5). The output unit 47 outputs a report concerning a verification result (step S6), and the process shown in FIG. 4 ends.

Figure 5:
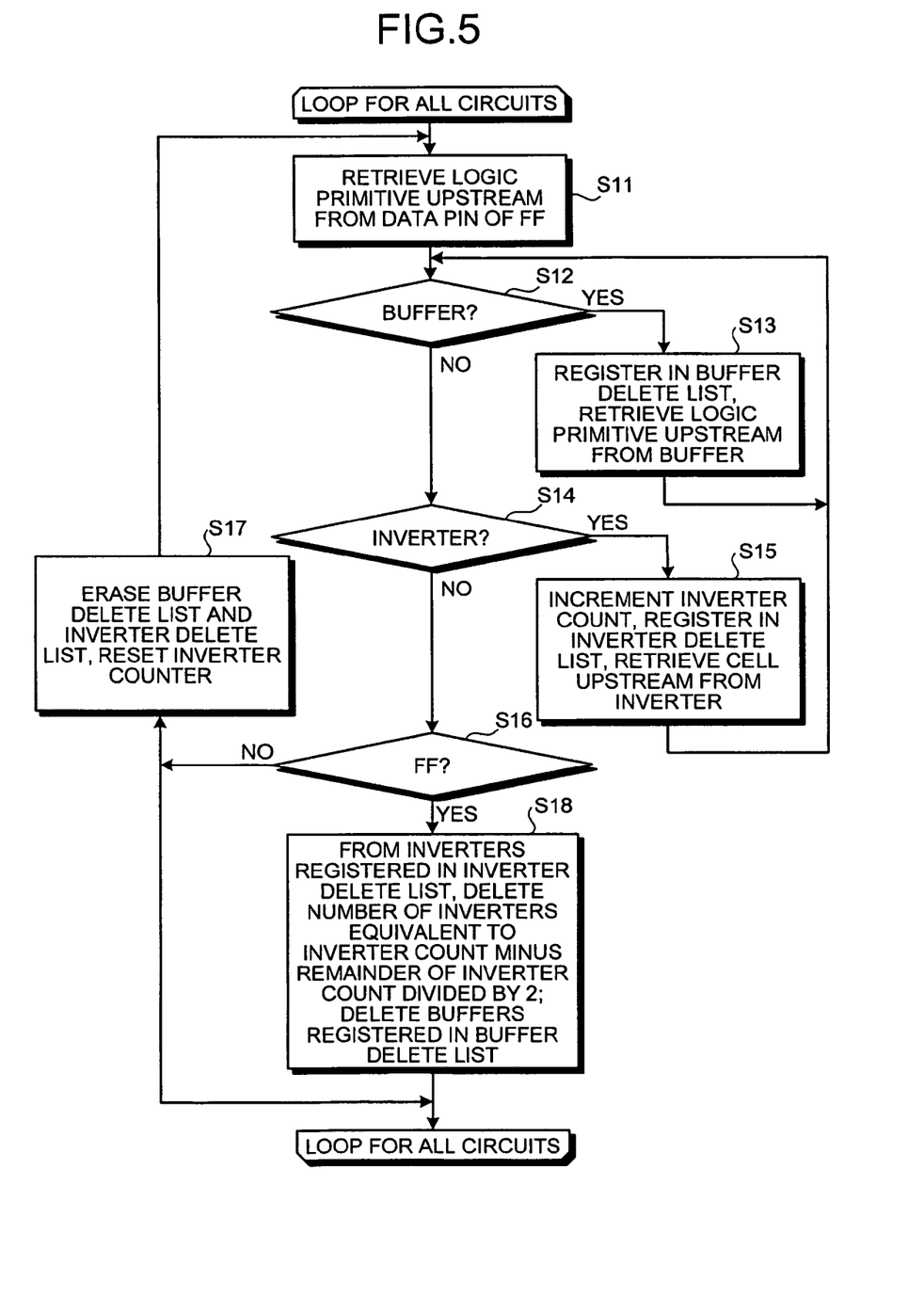
FIG. 5 is a flowchart of a compression process performed by a compressing unit.

FIG. 5 is a flowchart of the compression process performed by the compressing unit 43. As shown in FIG. 5, a logic primitive upstream from and coupled to the data pin of a target flip-flop is retrieved (step S11). It is judged whether the retrieved upstream circuit is a buffer (step S12). When the retrieved upstream circuit is a buffer (step S12: YES), the buffer is registered in a buffer delete list, a logic primitive upstream from the buffer is retrieved (step S13), and the process returns to step S12.

When the retrieved upstream circuit is not a buffer (step S12: NO), it is judged whether the retrieved upstream circuit is an inverter (step S14). When the retrieved upstream circuit is an inverter (step S14: YES), an inverter counter is incremented, the inverter is registered in an inverter delete list, and a cell upstream from the inverter is retrieved (step S15); and the process returns to step S12. When the retrieved upstream circuit is not an inverter (step S14: NO), it is judged whether the retrieved upstream circuit is a flip-flop (step S16).

When the retrieved upstream circuit is not a flip-flop (step S16: NO), the inverter counter is reset, the inverter delete list and the buffer delete list are erased (step S17), and the process returns to step S11. When the retrieved upstream circuit is a flip-flop (step S16: YES), an even number of the inverters registered in the inverter delete list and all the buffers registered in the buffer delete list are deleted (step S18), in which the inverter count minus the remainder of the inverter count divided by 2 is the number of the inverters to be deleted. The process proceeds to step S17. The series of steps S11 to S18 above are performed for the all of the circuits and a series of the compression process ends.

Figure 6:
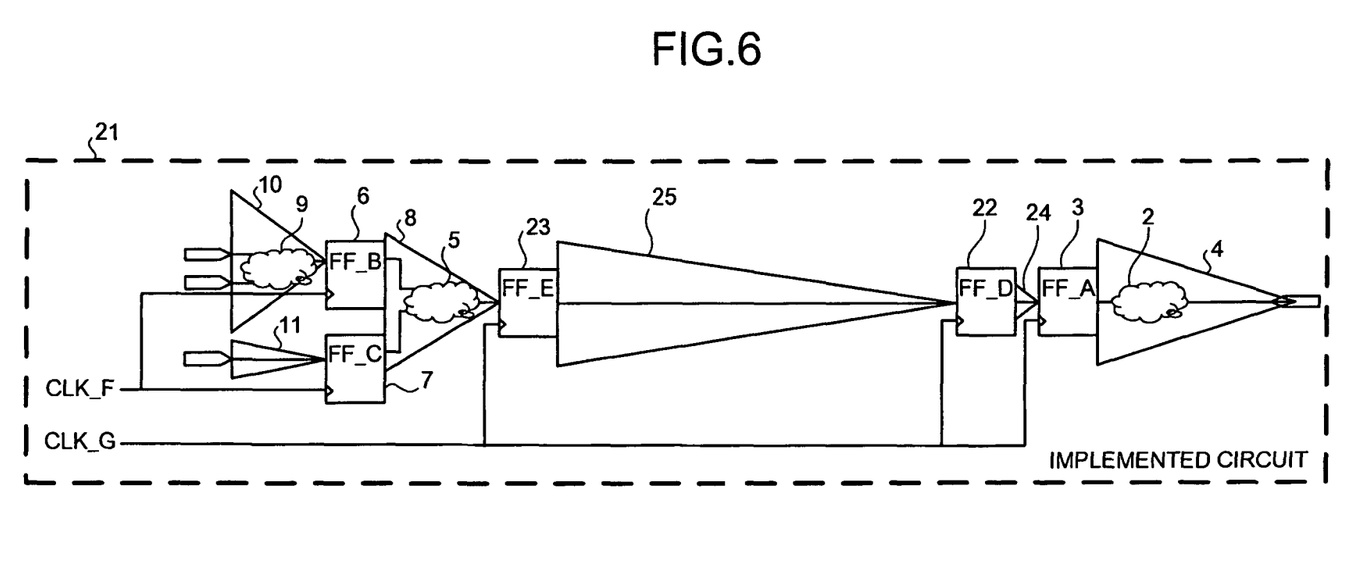
FIG. 6 is a schematic of an algorithm indicative of a circuit after the compression process.

FIG. 6 is a schematic of an algorithm indicative of a circuit after the compression process. For example, when the compression process is performed on the implemented circuit 21 shown in FIG. 1, the buffers 28 to 30 and the (even number of) inverters 26 and 27 between the fourth flip-flop (FF_D) 22 and the fifth flip-flop (FF_E) 23 are deleted as shown in FIG. 6.

Figure 7:
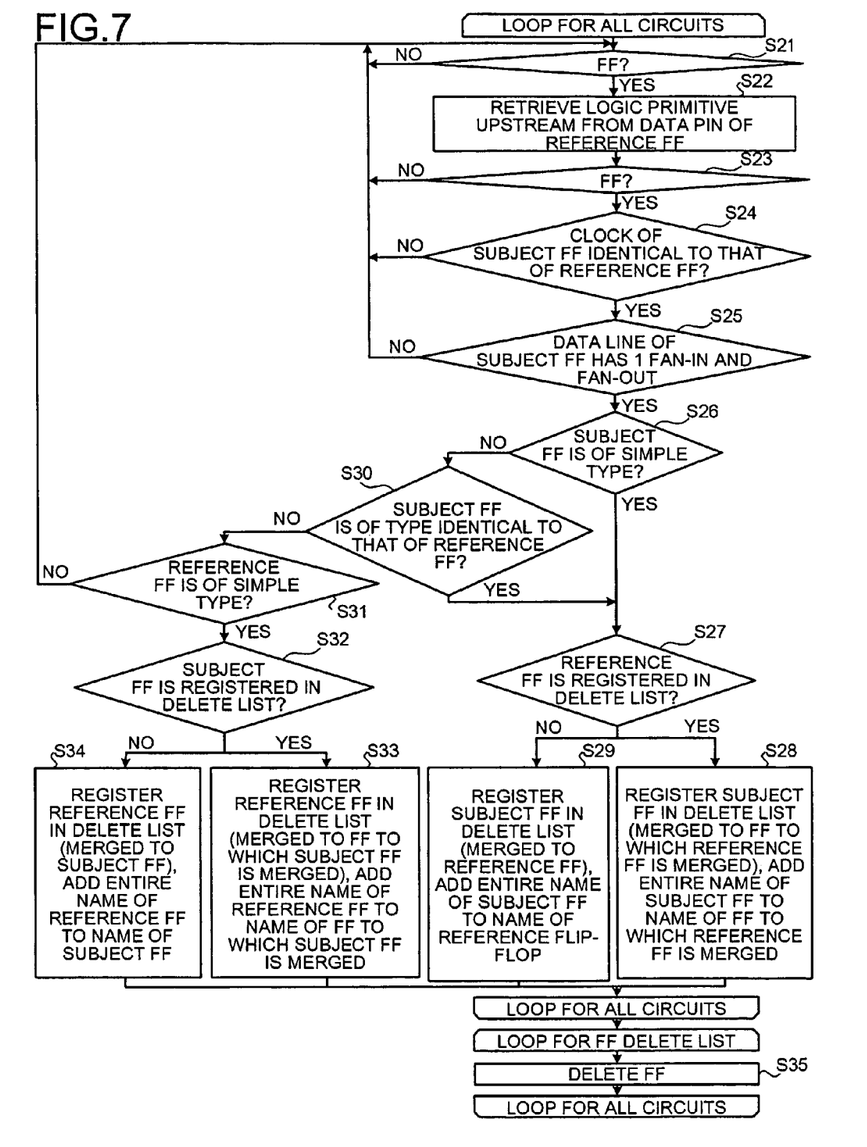
FIG. 7 is a flowchart of a merge process.

FIG. 7 is a flowchart of the merge process. Here, for simplicity, among two flip-flops, one is indicated as a reference flip-flop and the other as a subject flip-flop. As shown in FIG. 7, it is judged whether a target circuit is a flip-flop (step S21). When the target circuit is a flip-flop (step S21: YES), the flip-flop is regarded as the reference flip-flop, and a logic primitive upstream from the data pin of the reference flip-flop is retrieved (step S22). It is judged whether the retrieved upstream circuit is a flip-flop (step S23).

When the retrieved upstream circuit is a flip-flop (step S23: YES), the flip-flop is regarded as the subject flip-flop, and it is judged whether the clock of the subject flip-flop is identical to that of the reference flip-flop (step S24). When the clock is identical (step S24: YES), it is judged whether the data line of the subject flip-flop has a fan-in count and a fan-out count of one (step S25). When the fan-in count and the fan-out count of the data line is one (step S25: YES), the process proceeds to step S26. When the fan-in count or the fan-out count of the data line is two or more (step S25: NO), or when the retrieved element is not a flip-flop (step S21: NO and step S23: NO), the process returns to step S21. Another circuit is targeted and steps S21 to S25 are performed.

At step S26, it is judged whether the subject flip-flop is of the simple type previously explained herein. When the flip-flop to remain after the merge process is of the simple type (step S26: YES), it is judged whether the reference flip-flop is registered in a delete list (step S27). When the reference flip-flop is registered in a delete list (step S27: YES), the subject flip-flop is registered in the delete list. In this case, the subject flip-flop is merged to the flip-flop to which the reference flip-flop is merged, and the entire name of subject flip-flop is added to the name of the flip-flop to which the reference flip-flop is merged (step S28).

When the reference flip-flop is not registered in a delete list (step S27: NO), the subject flip-flop is registered in the delete list. In this case, the subject flip-flop is merged to the reference flip-flop, and the entire name of the subject flip-flop is added to the name of the reference flip-flop (step S29). When the subject flip-flop is not of the simple type (step S26: NO), it is judged whether the subject flip-flop is of an identical type to that of the reference flip-flop (step S30). When the subject flip-flop is of an identical type (step S30: YES), the process proceeds to step S27.

When the subject flip-flop is not of an identical type (step S30: NO), it is judged whether the reference flip-flop is of the simple type (step S31). When the reference flip-flop is not of the simple type (step S31: NO), the process returns to step S21. Another circuit is targeted and the process is performed from step S21. When the reference flip-flop is of the simple type (step S31: YES), it is judged whether the subject flip-flop is registered in the delete list (step S32). When the subject flip-flop is registered in the delete list (step S32: YES), the reference flip-flop is registered in the delete list. In this case, the reference flip-flop is merged to the flip-flop to which the subject flip-flop is merged, and the entire name of the reference flip-flop is added to the name of the flip-flop to which the subject flip-flop is merged (step S33).

When the subject flip-flop is not registered in the delete list (step S32: NO), the reference flip-flop is registered in the delete list. In this case, the reference flip-flop is merged to the subject flip-flop, and the entire name of the reference flip-flop is added to the name of the subject flip-flop (step S34). The series of processing from steps S21 to S34 above is performed for the all of circuits. Subsequently, the all of the flip-flops on the delete list are deleted (step S35), ending a series of the merge process shown in FIG. 7.

Figure 8:
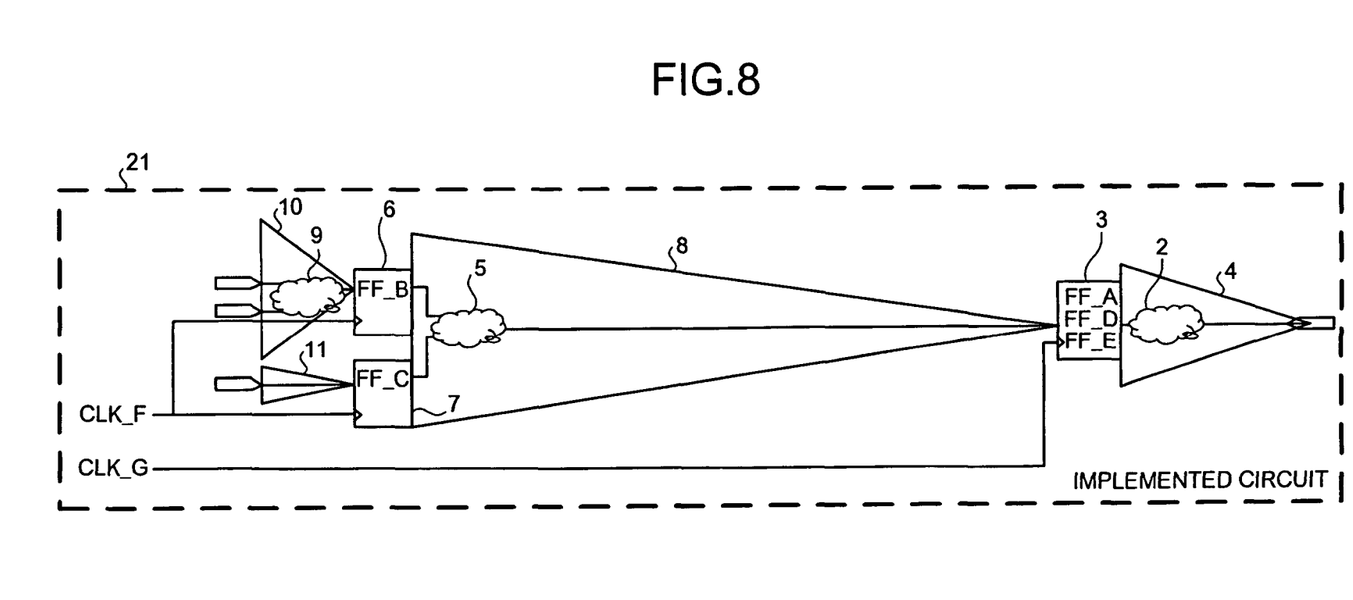
FIG. 8 is a schematic of an algorithm indicative of a circuit after the merge process.

FIG. 8 is a schematic of an algorithm indicative of a circuit after the merge process. For example, when the merge process is performed on the implemented circuit 21 shown in FIG. 1, the first, the fourth and the fifth flip-flops (FF_A), (FF_D) and (FF_E) are merged into one flip-flop as shown in FIG. 8. In the example shown, the flip-flop to be deleted after the merge process (FF_A) is the flip-flop to which the other flip-flops are merged and has a register name including FF_A, FF_D and FF_E. Hence, the implemented circuit 21 shown in FIG. 8 is logically identical to the implemented circuit 21 shown in FIG. 1.

Figure 9:
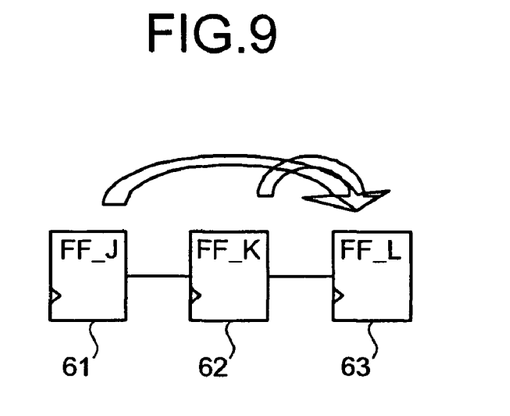
FIG. 9 is a schematic of a first merge pattern.
Figure 10:
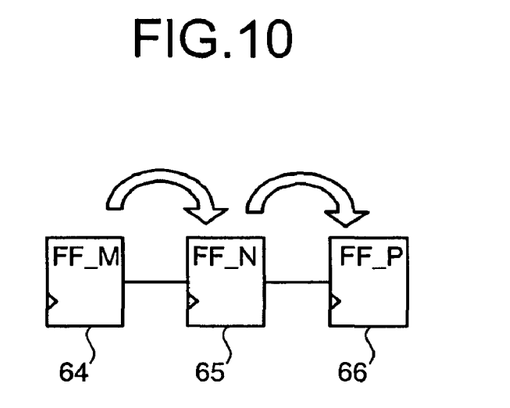
FIG. 10 is a schematic of a second merge pattern.
Figure 11:
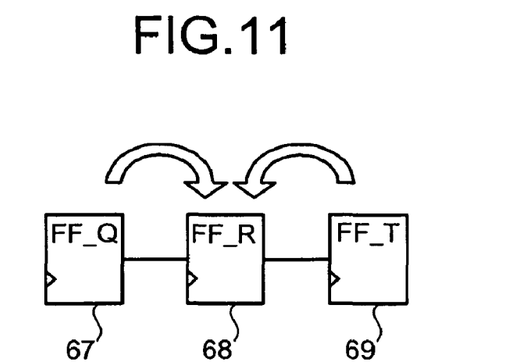
FIG. 11 is a schematic of a third merge pattern.
Figure 12:
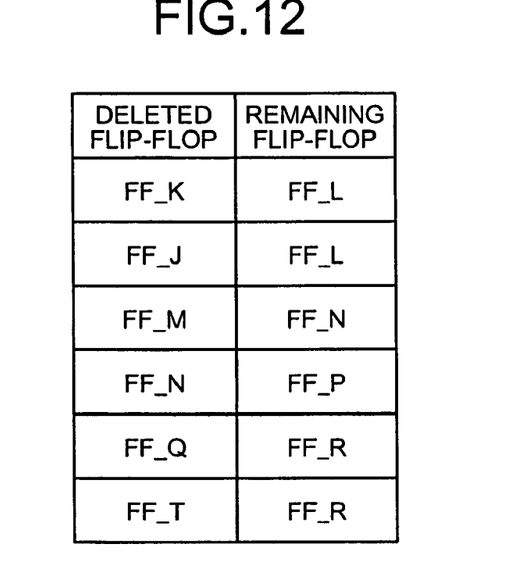
FIG. 12 is a schematic of a delete list.

FIGS. 9 to 11 are schematics of merge patterns of flip-flops. In the case of the pattern shown in FIG. 9, a flip-flop J (FF_J) 61 and a flip-flop K (FF_K) 62 are merged to a flip-flop L (FF_L) 63. In the case of the pattern shown in FIG. 10, a flip-flop M (FF_M) 64 is merged to a flip-flop N (FF_N) 65 that is merged to a flip-flop P (FF_P) 66. In the case of the pattern shown in FIG. 11, a flip-flop Q (FF_Q) 67 and a flip-flop T (FF_T) 69 are merged to a flip-flop R (FF_R) 68. FIG. 12 is a schematic of the delete list after the merge process shown in FIGS. 9 to 11.

Figure 13:
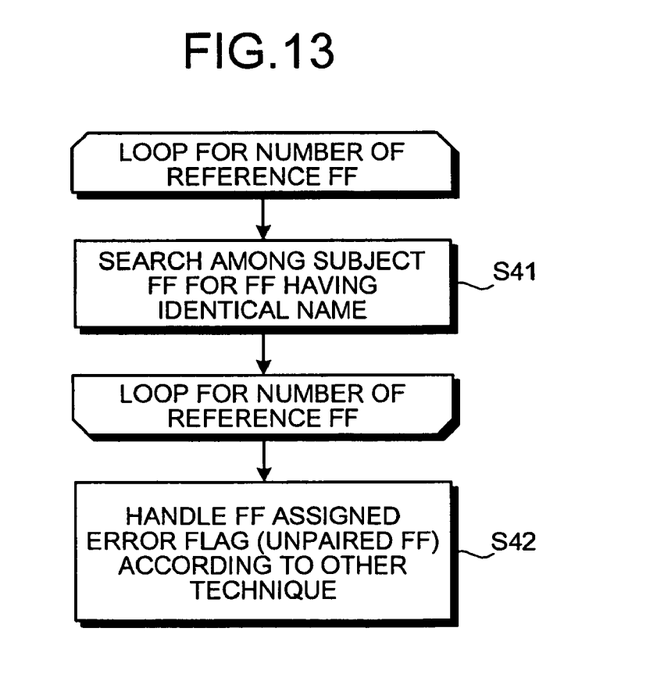
FIG. 13 is a flowchart of a matching process.

FIG. 13 is a flowchart of the matching process. For simplicity, a flip-flop in the reference circuit and a flip-flop in the implemented circuit are called a reference flip-flop and a subject flip-flop, respectively. As shown in FIG. 13, a name matching process is performed in which for each of the reference flip-flops, a subject flip-flop having an identical name is search for (step S41).

Flip-flops having identical names are paired. On the contrary, a reference flip-flop for which there is no flip-flop having an identical name is assigned an error flag. The name matching process will be explained in detail later. After the name matching process has been completed for each of the reference flip-flops, the reference flip-flops to which the error flags have been assigned are handled according to another technique (step S42). For example, a function matching process is performed in which flip-flops having an identical function are paired with each other.

Figure 14:
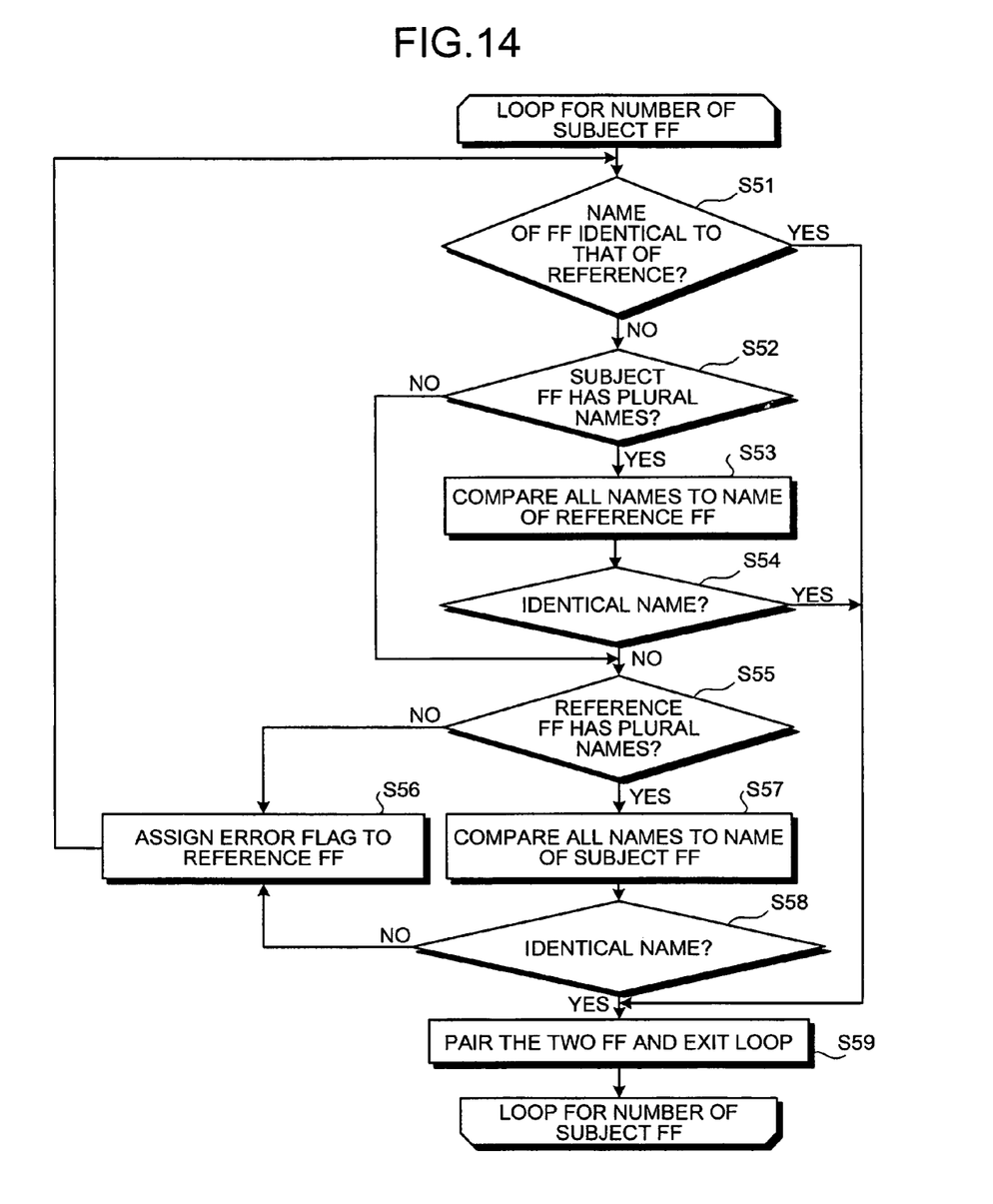
FIG. 14 is a flowchart of a name matching process.

FIG. 14 is a flowchart of a process that is included in the name matching process and involves selecting a flip-flop from the reference circuit and finding a corresponding flip-flop from the implemented circuit. For simplicity, here, the flip-flop selected from the reference circuit is a reference flip-flop and a flip-flop that is from the implemented circuit and subject to processing is a subject flip-flop. As shown in FIG. 14, it is judged whether the name of the subject flip-flop is identical to that of the reference flip-flop (step S51). When the name is not identical (step S51: NO), it is judged whether the subject flip-flop has plural names (step S52).

When the subject flip-flop has one name (step S52: NO), the process proceeds to step S55. When the subject flip-flop has plural names (step S52: YES), each of the names of the subject flip-flop is compared with the name of the reference flip-flop (step S53), and it is judged whether any of the names of the subject flip-flop is identical to the name of the reference flip-flop (step S54). When none of the names of the subject flip-flop is identical to the name of the reference flip-flop (step S54: NO), it is judged whether the reference flip-flop has plural names (step S55).

When the reference flip-flop has one name (step S55: NO), an error flag is assigned to the reference flip-flop (step S56), and the process returns to step S51. When the reference flip-flop has plural names (step S55: YES), the name of the subject flip-flop is compared with each of the names of the reference flip-flop (step S57). It is judged whether the name of the subject flip-flop is identical to any of the names of the reference flip-flop (step S58).

When the name of the subject flip-flop is not identical any of the names of the reference flip-flop (step S58: NO), the process proceeds to step S56. When the name of the subject flip-flop is identical to any of the names of the reference flip-flop (step S58: YES), or in the case of step S51: YES or step S54: YES, the name matching process ends. The process from step S51 to step S58 is performed for all of the subject flip-flops to find a subject flip-flop having an identical name to the reference flip-flop. When the subject flip-flop having identical name to the reference flip-flop is found, the subject flip-flop and the reference flip-flop are paired (step S59), and logic cones that start from input terminals of the subject flip-flop and the reference flip-flop that are paired are the subject of logic equivalence verification. This process is performed for all of the reference flip-flops.

For example, since the flip-flop to be deleted after the merge process (FF_A) 3 in the reference circuit 1 shown in FIG. 1 has the register name of FF_A and the register name of the flip-flop to be deleted after the merge process (FF_A) 3 in the implemented circuit 21 shown in FIG. 8 includes FF_A, the name of the flip-flop to be deleted after the merge process (FF_A) 3 in the reference circuit 1 and the name of the flip-flop to be deleted after the merge process (FF_A) 3 in the implemented circuit 21 is identical. Therefore, when comparison and verification is performed for the reference circuit 1 and the implemented circuit 21 shown in FIG. 1, the second logic cone 8 in the former and the latter circuit begins from the input of the flip-flop to be deleted after the merge process (FF_A) 3 having the register name of FF_A; hence, a pair according to name is automatically created and it is concluded that the logic of both of the circuits is identical.

As explained above, according to the embodiment described above, when the logical equivalence verification is performed on the reference circuit 1 and the implemented circuit 21 into which a logically equivalent flip-flop such as a synchronizer and a level shifter is inserted, a result indicating that the logic is not identical and obtained as a consequence of the insertion of the logically equivalent flip-flop may be prevented. Therefore, unlike conventional techniques, logic equivalence verification of a circuit into which a logically equivalent flip-flop has been inserted may be automatically performed without manual operations. Furthermore, even for a circuit into which a logically equivalent flip-flop is inserted, such as a level shifter, application of the embodiment thereto enables a reduction in verification points, resulting in a reduction in the time required for verification.

The computer product explained in the embodiment may be implemented by a computer such as a personal computer and a workstation executing a program that is prepared in advance. This program is recorded on a computer-readable recording medium such as a hard disk, a flexible disk, a CD-ROM, an MO, and a DVD, and is executed by being read out from the recording medium by a computer. This program may be a transmission medium that may be distributed through a network such as the Internet.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A verifying apparatus comprising:
    a merging unit that deletes a first flip-flop which is logically equivalent to a second flip-flop and merges the first flip-flop to the second flip-flop on a reference circuit and an implemented circuit respectively based on design data of the reference circuit and the implemented circuit which is logically equivalent to the reference circuit; and
    a matching unit that matches the second flip-flop which remains after the merge process on the reference circuit and the second flip-flop on the implemented circuit according to name checking whether the name of the second flip-flop on the reference circuit and the name of the second flip-flop on the implemented circuit are identical, after the merging unit deletes and merges the first flip-flop, and
    wherein the merging unit deletes and merges a plurality of the first flip-flops, among which is an upstream flip-flop having an output logic identical to an input logic of a downstream flip-flop.

2. The verifying apparatus according to claim 1, wherein the merging unit adds a name of the first flip-flop to a name of the second flip-flop.

3. The verifying apparatus according to claim 1, wherein the first flip-flop is driven by a clock signal that drives the second flip-flop.

4. The verifying apparatus according to claim 3, wherein the first flip-flop is of a type having a data line with one input and one output.

5. The verifying apparatus according to claim 3, wherein the first flip-flop is of a type identical to that of the second flip-flop.

6. The verifying apparatus according to claim 1, further comprising a compressing unit that deletes a buffer or an even number of inverters between a plurality of the first flip-flops before the merging unit deletes and merges the first flip-flops.

7. A verifying method comprising:
    deleting by a computer, a first flip-flop which is logically equivalent to a second flip-flop and merging the first flip-flop to the second flip-flop on a reference circuit and an implemented circuit respectively, based on design data of the reference circuit and the implemented circuit which is logically equivalent to the reference circuit; and
    matching the second flip-flop on the reference circuit and the flip-flop which remains after the merge process on the implemented circuit according to name checking whether the name of the second flip-flop which remains after the merge process on the reference circuit and the name of the second flip-flop on the implemented circuit are identical, after the first flip-flop is merged at the merging, and
    wherein the merging includes merging by deleting and merging a plurality of the first flip-flops, among which is an upstream flip-flop having an output logic identical to an input logic of a downstream flip-flop.

8. The verifying method according to claim 7, wherein the merging includes merging by adding a name of the first flip-flop to a name of the second flip-flop.

9. The verifying method according to claim 7, wherein the first flip-flop is driven by a clock signal that drives the second flip-flop.

10. The verifying method according to claim 9, wherein the first flip-flop is of a type having a data line with one input and one output.

11. The verifying method according to claim 9, wherein the first flip-flop is of a type identical to that of the second flip-flop.

12. The verifying method according to claim 7, further comprising deleting a buffer or an even number of inverters between a plurality of the first flip-flops before the first flip-flops are merged at the merging.

13. A non-transitory computer-readable recording medium storing therein a computer program that causes a computer to execute an operation, comprising:
    deleting a first flip-flop which is logically equivalent to second flip-flop and merging the first flip-flop to the second flip-flop on a reference circuit and an implemented circuit respectively, based on design data of the reference circuit and the implemented circuit which is logically equivalent to the reference circuit; and
    matching the second flip-flop on the reference circuit and the flip-flop which remains after the merge process on the implemented circuit according to name checking whether the name of the second flip-flop which remains after the merge process on the reference circuit and the name of the second flip-flop on the implemented circuit are identical, after the first flip-flop is merged at the merging, and
    wherein the merging includes merging by deleting and merging a plurality of the first flip-flops, among which is an upstream flip-flop having an output logic identical to an input logic of a downstream flip-flop.

14. The computer-readable recording medium according to claim 13, wherein the merging includes merging by adding a name of the first flip-flop to a name of the second flip-flop.

15. The computer-readable recording medium according to claim 13, wherein the first flip-flop is driven by a clock signal that drives the second flip-flop.

16. The computer-readable recording medium according to claim 15, wherein the first flip-flop is of a type having a data line with one input and one output.

17. The computer-readable recording medium according to claim 15, wherein the first flip-flop is of a type identical to that of the second flip-flop.

18. A verifying apparatus comprising:
    a merging unit that deletes a first flip-flop which is logically equivalent to a second flip-flop and merges the first flip-flop to the second flip-flop on a reference circuit and an implemented circuit respectively based on design data of the reference circuit and the implemented circuit which is logically equivalent to the reference circuit; and a matching unit that matches the second flip-flop which remains after the merge process on the reference circuit and the second flip-flop on the implemented circuit according to name checking whether the name of the second flip-flop on the reference circuit and the name of the second flip-flop on the implemented circuit are identical, after the merging unit deletes and merges the first flip-flop, and wherein each of the second flip-flop on the reference circuit and the second flip-flop on the implemented circuit has a plurality of names one of which is a name of the first flip-flop deleted and merged to the second flip-flop, and the matching unit matches each of the names of the second flip-flop on the reference circuit and each of the names of the second flip-flop on the implemented circuit, and checks whether any of the names of the second flip-flop on the reference circuit is identical to one of the names of the second flip-flop on the implemented circuit.

* * * * *